(12) United States Patent
Bruce et al.

(10) Patent No.: US 6,348,364 B1
(45) Date of Patent: Feb. 19, 2002

(54) NAVIGATION USING 3-D DETECTABLE PATTERN

(75) Inventors: Victoria J. Bruce, Austin; Leslie Stevenson, Cedar Creek; Kenneth J. Morrissey; Charles Bachand, both of Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/383,733

(22) Filed: Aug. 26, 1999

(51) Int. Cl.[7] .......................... H01L 21/44; H01L 21/48; H01L 21/50
(52) U.S. Cl. ..................... 438/108; 438/14; 438/734
(58) Field of Search ..................... 438/108, 14, 734, 438/735, 8

(56) References Cited

U.S. PATENT DOCUMENTS 5,821,549 A * 10/1998 Talbot et al.
5,952,247 A * 9/1999 Livengood et al.

* cited by examiner

*Primary Examiner*—Kevin M. Picardat
*Assistant Examiner*—D. M. Collins

(57) ABSTRACT

According to one aspect of the disclosure, the present invention provides methods and arrangements for milling the substrate of a semiconductor device to expose a selected region in the substrate, wherein the semiconductor device has a grid formed in the device to provide lateral and depth position indication during an etch/milling process. In an example implementation, the grid is three dimensional and is used during device analysis for navigation while removing substrate to access a selected circuit area via the backside of flip-chip device. As substrate is removed, the tools are aligned as indicated by the grid.

17 Claims, 6 Drawing Sheets

NAVIGATION USING 3-D DETECTABLE PATTERN

FIELD OF THE INVENTION

The invention relates to semiconductor device assemblies, and more particularly to techniques for analyzing and debugging circuitry associated with integrated circuits such as those accessible from their backsides.

BACKGROUND OF THE INVENTION

In recent years, the semiconductor industry has realized tremendous advances in technology which have permitted dramatic increases in circuit density and complexity, and equally dramatic decreases in power consumption and package sizes. Present semiconductor technology now permits single-chip microprocessors with many millions of transistors, operating at speeds of hundreds of MIPS (millions of instructions per second) to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

There have been a number of semiconductor dies and packaging types used to address these needs for increased numbers of external electrical connections. For example, to increase the number of pad sites available for a die, especially for multi-layer type dies, an increasingly popular packaging technique called controlled collapse chip connection or flip-chip packaging has been developed. In this technology, the bonding pads are provided with metal (solder) bumps. The bonding pads need not be on the periphery of the die and hence are moved to the site nearest the transistors and other circuit devices formed in the die. As a result, the electrical path to the pad is shorter. Electrical connection to the package is made when the die is flipped over the package with corresponding bonding pads and soldered. Once a flip-chip die is attached to the package, the backside portion of the die remains exposed. As a result, the dies are often referred to as "flip-chip" devices. Each bump connects to a corresponding package inner lead. The packages that result are lower profile and have lower electrical resistance and a shortened electrical path.

The output terminals of such packages vary, depending on the package type. For example, some output terminals are ball-shaped conductive bump contacts (usually solder, or other similar conductive material), and they are typically disposed in a rectangular array. These packages are occasionally referred to as "Ball Grid Array" (BGA). Another type of package, commonly known as pin grid array (PGA) package, implements the output terminals as pins.

For BGA, PGA and other types of packages, once the die is attached to the package, the backside portion of the die remains exposed. The transistors and other circuitry are generally formed in a very thin epitaxially grown silicon layer on a single crystal silicon wafer from which the die is singulated. The side of the die including the epitaxial layer containing the transistors, and the other active circuitry is often referred to as the circuit side of the die or front side of the die. The circuit side of the die is positioned very near the package. The circuit side opposes the backside of the die. Between the backside and the circuit side of the die is single crystalline silicon. The positioning of the circuit side provides many of the advantages of the flip-chip.

In some instances the orientation of the die with the circuit side face down on a substrate may be a disadvantage or present new challenges. For example, when a circuit fails or when it is necessary to modify a particular chip, access to the transistors and circuitry near the circuit side is typically obtained only from the backside of the chip. This is challenging since the transistors are in a very thin layer (about 10 micrometers) of silicon buried under the bulk silicon (greater than 500 micrometers). Thus, the circuit side of the flip-chip die is not visible or accessible for viewing using optical or scanning electron microscopy.

Techniques have been developed to access the circuit even though the circuitry of the integrated circuit (IC) is buried under the bulk silicon. For example, infrared (IR) microscopy is capable of imaging the circuit because silicon is relatively transparent in these wavelengths of the radiation. However, because of the absorption losses of IR radiation in silicon, it is generally required to thin the die to less than 100 microns in order to view the circuit using IR microscopy. On a die that is 725 microns thick, this involves removing at least 625 microns of silicon before IR microscopy can be used.

Thinning the die for failure analysis of a flip-chip bonded IC is usually accomplished in two or three steps. First, the backside of the die is thinned across the whole die surface. This is also referred to as global thinning. Global thinning is done to allow viewing of the active circuit from the backside of the die using IR microscopy. Mechanical polishing is one method for global thinning. Second, using IR microscopy, an area is identified for accessing to a particular area of the circuit. In connection with the second step and typically before the underlying circuitry is analyzed, a third step involves local thinning an access path (or hole) to further thin a specific region that is less than the whole die surface of the silicon.

Using the above process to accurately locate and access underlying circuitry is not always straight forward. For instance, when forming an access hole of this type, it is often difficult to navigate so that the access hole is precisely over the targeted underlying circuitry. It can also be difficult to mill through silicon and to stop at precise depths. Without precisely controllable thinning in lateral and vertical directions, device analysis can be jeopardized.

SUMMARY OF THE INVENTION

The present invention provides methods and apparatuses for detecting the location of a portion of the active circuitry in an integrated circuit, for example, near the circuit side of an integrated circuit die. In this manner, guesswork as to the location of the circuitry while the backside of a die is being removed is eliminated, and the ability to navigate during the milling process is improved. Consequently, failure analysis and debugging of the circuitry associated with a particular integrated circuit is improved. Furthermore, when the position of the circuitry with respect to the milling progress is known or can be determined from the backside removal of the silicon, accessing the circuitry can be accomplished in less time.

In one example embodiment, the present invention provides a method for manufacturing and analyzing the substrate of a semiconductor device to expose selected positions in the substrate. The method includes: forming a three-dimensional pattern in the semiconductor device over a circuit region, the three-dimensional pattern configured and arranged for post-manufacture analysis; and analyzing the circuit region by: removing substrate material from the semiconductor device from a side of the die opposite the circuit region until at least a part of the pattern is detected, and using the detected pattern to determine lateral and depth positions.

In another example embodiment, the present invention involves a method for removing (e.g., by milling) substrate of a semiconductor device and exposing a selected region in the substrate. A three-dimensional pattern is configured and arranged in the semiconductor device over a circuit region, the pattern including a plurality of symbols for recognition using visual means applied to the side of the device opposite the circuit region.

BRIEF DESCRIPTION OF THE DRAWINGS

The invention may be more completely understood in consideration of the following detailed description of various embodiments of the invention in connection with the accompanying drawings, in which.

Figure 1:
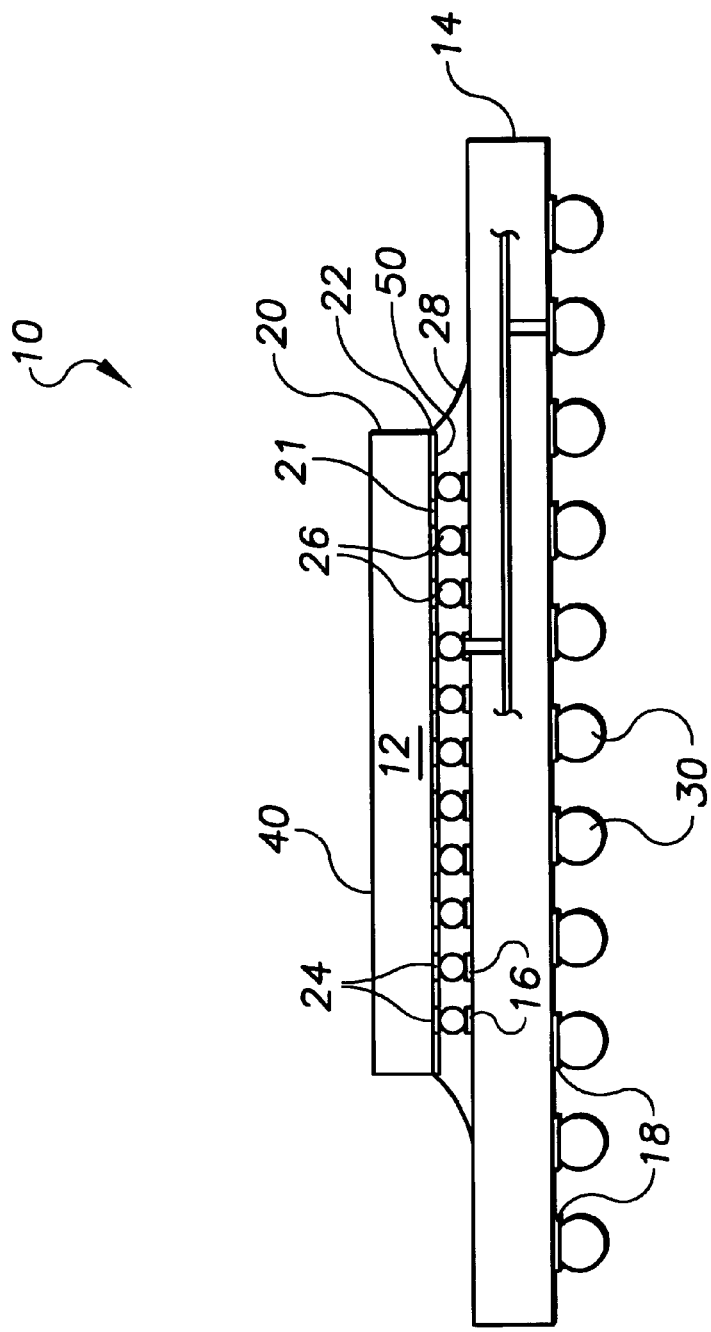
FIG. 1 shows a side view of a flip chip packaged integrated circuit, according to an example application of the present invention.

While the invention is amenable to various modifications and alternative forms, specifics thereof have been shown by way of example in the drawings and will be described in detail. It should be understood, however, that the intention is not to limit the invention to the particular embodiment described. On the contrary, the invention is to cover all modifications, equivalents, and alternatives falling within the spirit and scope of the invention as defined by the appended claims.

DETAILED DESCRIPTION

The present invention is believed to be advantageous for use with a variety of different types of integrated circuit packages and has been found to be particularly advantageous for use in connection with aligning to circuit points while accessing the backside of flip-chip integrated circuit packages ("flip-chips"). While the invention is not necessarily limited to such package types, an appreciation of various aspects of the invention is gained using example applications of this type as a discussion tool.

FIG. 1 shows a side view 10 of one such example embodiment in the form of a flip chip type die 12 assembled to a silicon substrate structure 14 according to the present invention. Flip chip die 12 has a circuit side 50 and a backside 40. The circuit side 50 includes a number of circuit devices formed near the circuit side in a portion of the die known as the epitaxial layer 22. The epitaxial layer 22 has a thickness in the range of 1 to 15 microns. The portion of the die shown above the epitaxial layer is known as the bulk polysilicon layer 20. The solder bumps 26 are made on the circuit side 50 at pads 24 and are used for the inputs and outputs to the circuitry in the die 12. The flip chip type die 12 is attached to package substrate 14, such as a package for a flip chip via the solder bumps on the die 12. The package substrate 14 includes pads 16 which are arranged to correspond to the pattern of solder bumps on the die 12. The region between integrated circuit 12 and package substrate 14 is filled with an under-fill material 28 to encapsulate the solder bump connections and provide additional mechanical benefits. The pads 16 are coupled via circuitry to pads 18 on the package substrate. Solder bumps 30 are formed on the pads 18. The solder bumps 30 are the inputs and outputs to the circuitry associated with the package substrate 14.

As discussed and illustrated in connection with subsequent figures, the flip-chip die 12 includes an alignment grid built into and with the circuitry of the flip-chip die 12, near an intersection 21 between the epitaxial layer 22 and the bulk polysilicon layer 20. After the die is manufactured as such, analysis from the backside is detected by milling an imaging path through the backside and, using conventional microscopy tools, aligning the milling equipment and/or circuitry probing equipment via the detected alignment grid.

Figure 2A:
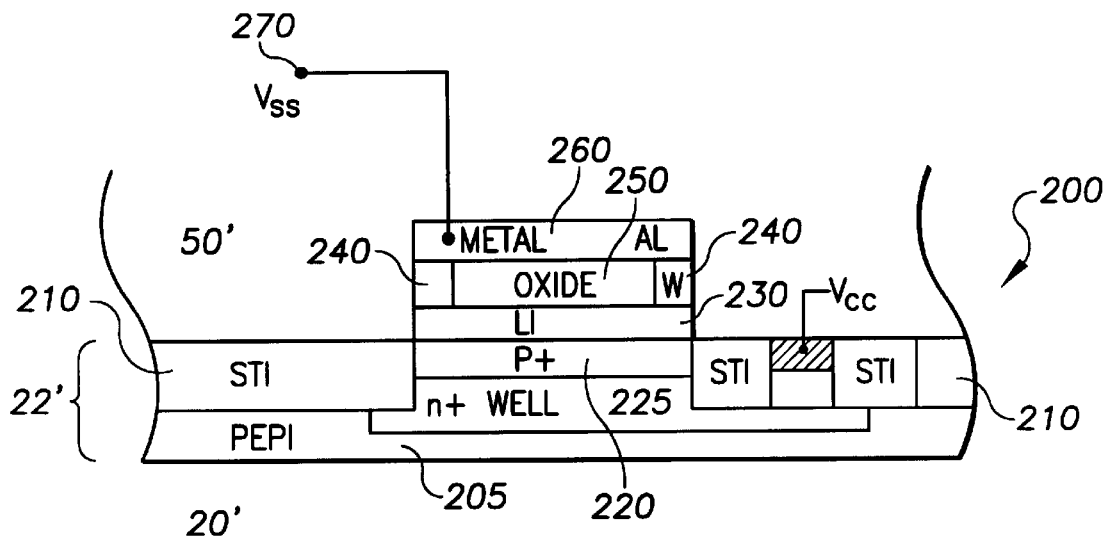
FIGS. 2a and 2b show alternate example embodiments, using a cross-sectional view, of an alignment grid as implemented inside of a flip chip die, according to the present invention.

FIG. 2a shows a cross-sectional view of an alignment point formed within a semiconductor die 200, according to another example embodiment of the present invention. The alignment point of FIG. 2a is shown with a flipped orientation as in FIG. 1, with the circuit side 50' at the top and the bulk polysilicon layer 20' at the bottom. The structure forming the alignment point begins in the epitaxial layer 22', with shallow trench isolation (STI) regions 210 formed adjacent a silicon region 205. The region 220 between the STI regions 210 is typically material such as STI. Alternatively, useful in connection with an endpoint detection process using microscopy tools, the region 220 between the STI regions 210 is p+ active material for enhanced responsiveness of the marker.

Local interconnect (LI) 230 is tied to metal layer 260 by plugs 240 formed in an insulative layer 250 having material such as oxide. In a more specific example embodiment, metal layer 260 includes aluminum, and plugs 240 include tungsten. The metal layer 260 is coupled to a ground or Vss at 270. Coupling the metal layer 260 to Vss creates a connection from the material in region 220 through the LI 230, plugs 240, and metal layer 260. Such coupling with the use of doped material in region 220 helps hold the silicon material 205 at Vss, which may enhance endpoint response. The semiconductor die may also include a n-well region 225. The n-well region 225 is coupled to Vcc at 275.

As discussed further below, the alignment point of FIG. 2a is used in connection with a backside substrate removal process to align tools to the circuitry within the die. As each layer is removed, the patterns of the alignment point are readily discernible for a continuation alignment calibration and depth verification.

Figure 2B:
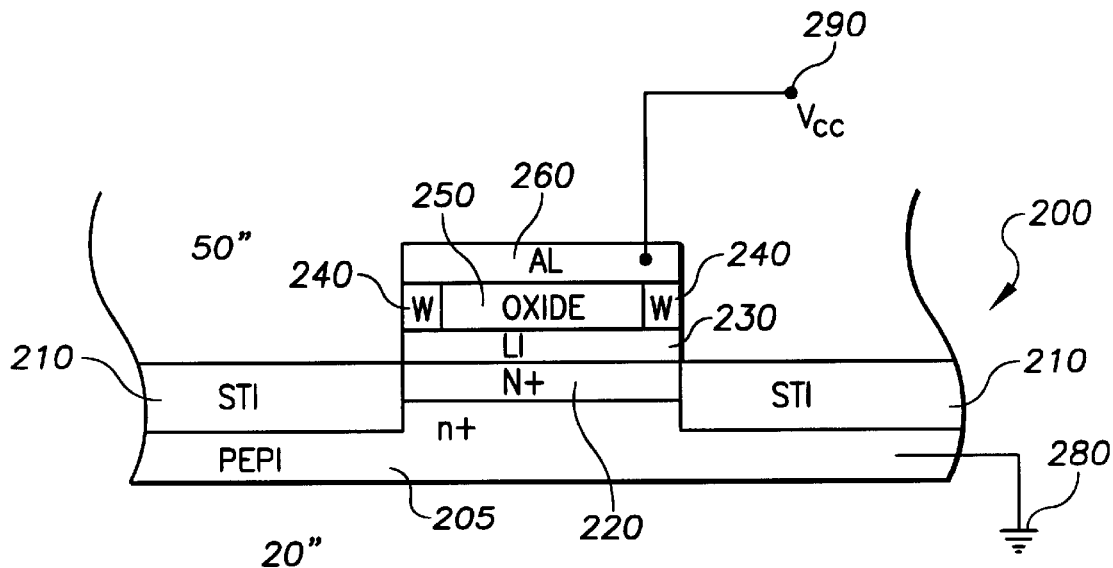

FIG. 2b illustrates a cross-sectional view of another example embodiment of an alignment point formed in a semiconductor die, such as the die 12 of FIG. 1. This example embodiment includes STI regions 210 formed adjacent the silicon material 205. Region 220 includes n-type doped material adjacent the LI 230. The LI 230 is tied to metal layer 260 by plugs 240 formed in an insulative layer 250. Metal layer 260 is coupled to Vcc at 290, thereby coupling the n-doped material 220 to Vcc via the LI 230, plugs 240, and metal layer 260. The bulk silicon material 205 is coupled to Vss at 280.

The above structure is also advantageous in connection with current-based endpoint detection techniques. Specifically, alignment involving the measurement of changes in diode current between Vcc and Vss, such as OBIC endpointing, benefit from the use of the arrangements shown in FIGS. 2a and 2b. As the silicon material 205 is milled away, or if the diode is briefly exposed to light, changes manifest in connection with the diode, e.g., changes in conducted current. This change is recognized (and may be interpreted) by a user and gives an indication that the alignment marker is close. The use of this technique improves the calibration process for the OBIC endpoint. The LI 230 or the metal 260 may be detected for accurate locking and alignment.

The alignment points may be formed using any of a number of conventional methods in conjunction with the normal steps in a semiconductor manufacture process. Portions of the alignment points can be made of a metal, such as tungsten or aluminum, or another substance that is recognizable by visual detection techniques. Example alternative detection techniques include IR imaging and substance-density detection techniques. The designated locations may be set at a predetermined distance from selected regions within the semiconductor device. Once the location of the alignment points is known, the locations of the selected regions within the semiconductor device can be determined by using the known predetermined distance from the alignment points. This provides accurate determination of the location of selected regions for milling, testing, or other purposes.

Figure 3A:
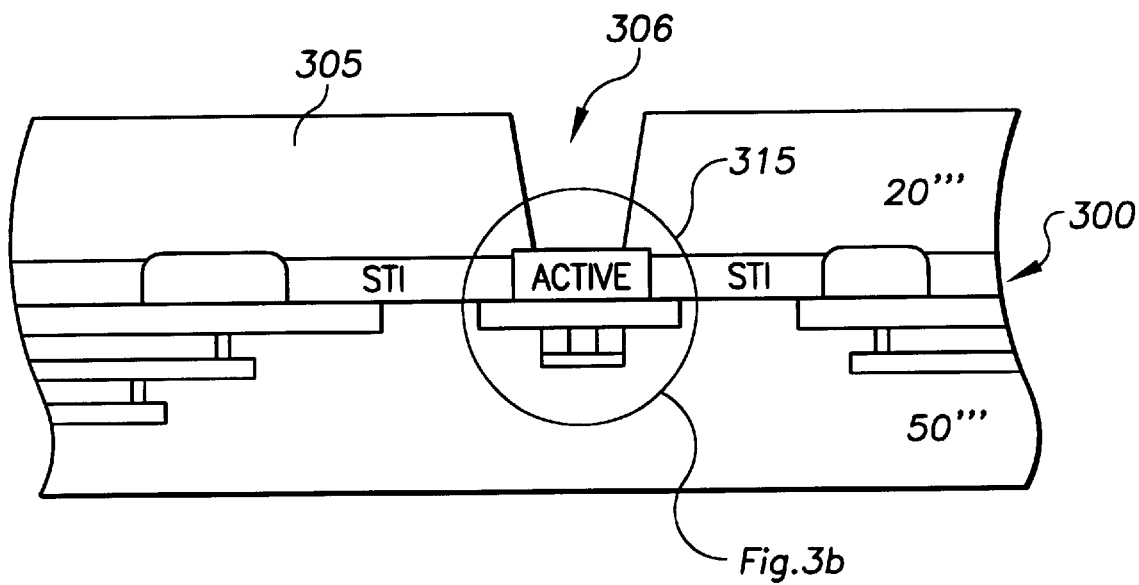
FIGS. 3a and 3b show cross-sectional views of an alignment grid as implemented inside of a flip chip die, according to another example embodiment of the present invention.
Figure 3B:
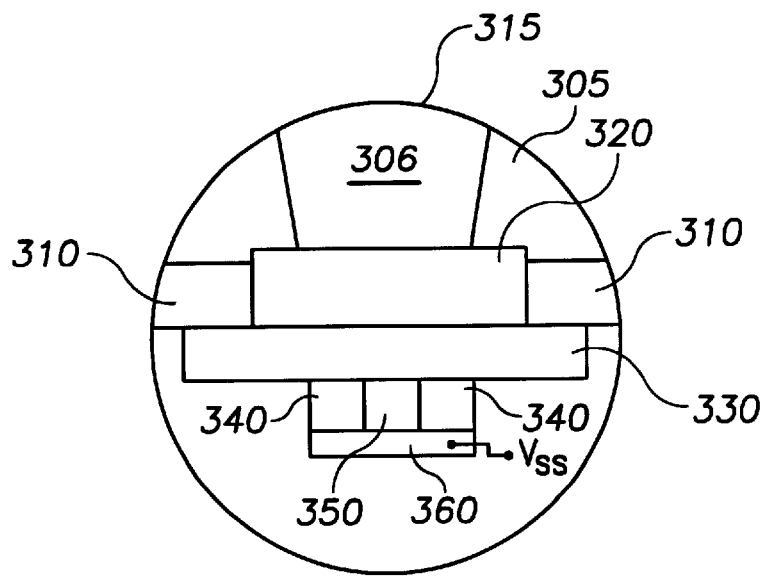

FIG. 3a illustrates a cross-sectional view of another example embodiment of an alignment grid formed in semiconductor die, such as the die 12 of FIG. 1, wherein the active region of an alignment point 315 has been exposed, e.g., via a process such as FIB milling. FIG. 3b shows an enlarged view of the alignment point 315. Through an imaging path 306 in the backside, the alignment point can be recognized as including LI 330, insulative layer 350, plugs or contacts 340, and a metal layer 360. Conventional microscopy tools permit the alignment grid to be detected unimpeded by such underlying active regions 320 or, depending on the implementation's location of the imaging path 306, by underlying STI regions 310.

This grid approach provides an improvement over milling directly to the selected area in the semiconductor device, since the possibility of milling in an improper region is less once part of the device is accurately located. Even if the initial milling process is not accurate, the possibility of ruining individual circuitry within the device is reduced. Once an initial coarse milling process is complete and the location of the alignment point is known, subsequent milling processes may use that point as a reference to refine milling and/or access to the circuitry.

Figure 4A:
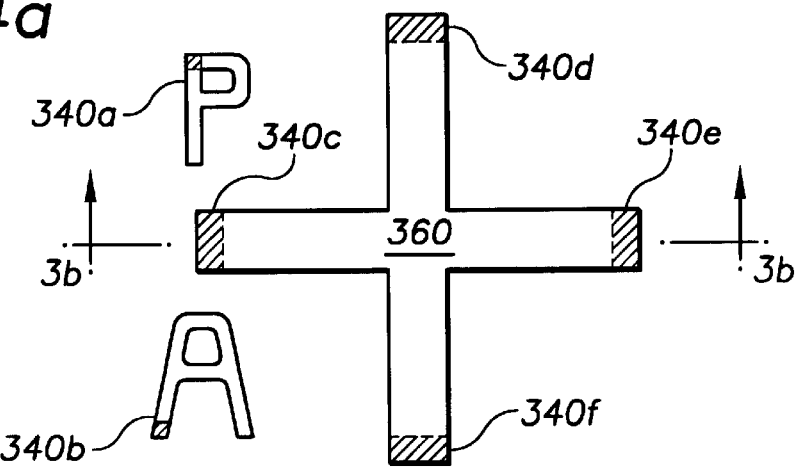
FIGS. 4a, 4b and 4c show the alignment grid of FIG. 3b from front side perspectives at various levels within the flip-chip die, also in accordance with an example embodiment of the present invention.
Figure 4B:
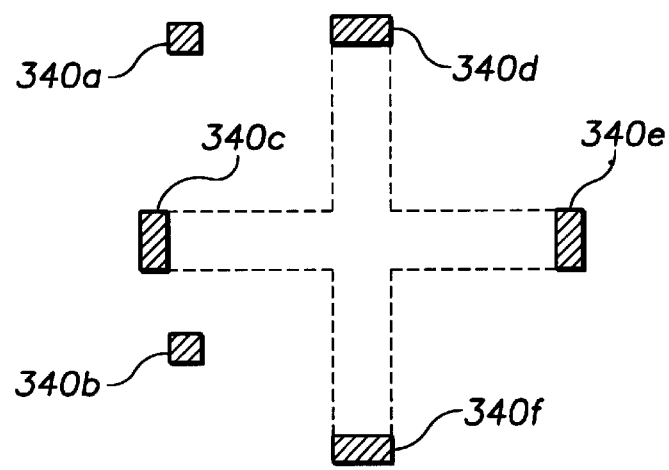
Figure 4C:
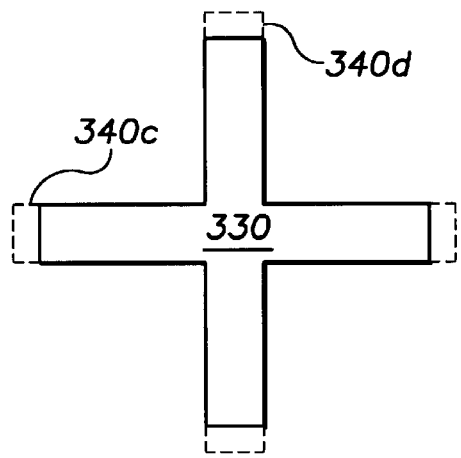

FIGS. 4a, 4b and 4c illustrate the alignment grid of FIG. 3 from top-down perspectives at various levels within a flip-chip die. Viewing the grid as though substrate material is being removed from circuit side, FIG. 4a depicts sufficient die substrate being removed to expose the Vss layer 360 of FIG. 3b. The letters "P" and "A" are used to identify polysilicion and active regions underlying this layer 310.

FIG. 4a also depicts, using crosshatched lines, the contact regions 340 of FIG. 3b that underlie the upper layer 310. These contact regions 340 are identified using reference numerals 340a through 340f. In FIG. 4b, where the substrate containing the upper layer 310 has been removed, these contact regions 340 are identified using the same reference numerals 340a through 340f.

FIG. 4c depicts the die at the next stage of the substrate-removal process with both the upper layer 310 and the layer including contact regions having been removed. The remaining layer, in one example milling process according the present invention, is a local interconnect layer.

Figure 5:
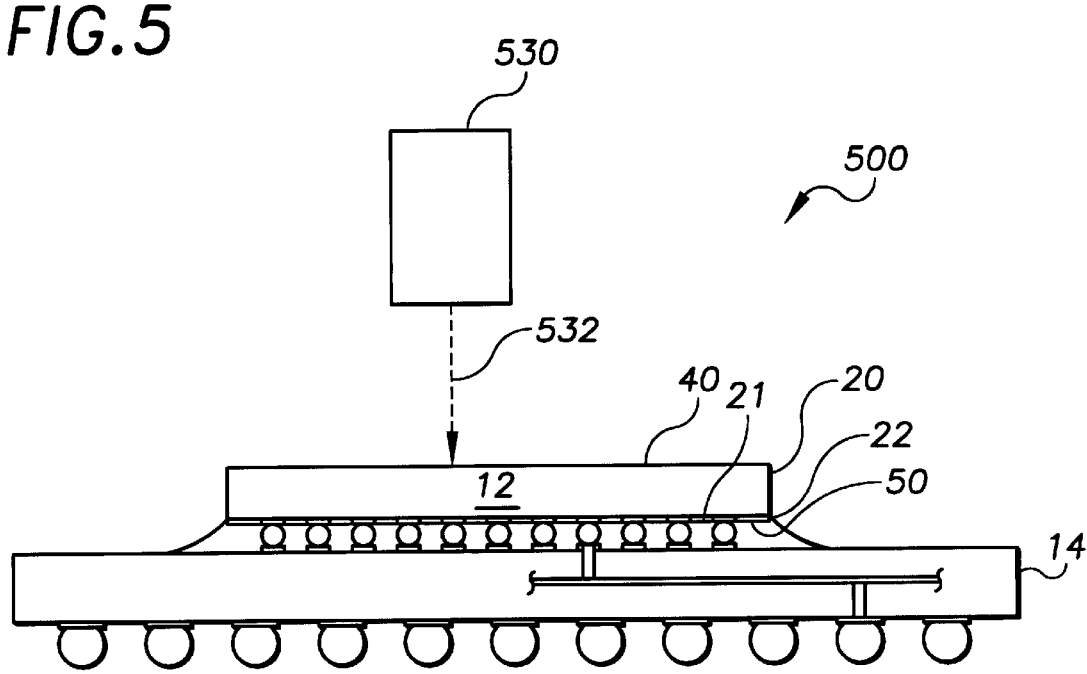
FIG. 5 shows an example system for milling and navigating through the backside of a semiconductor device using an alignment grid, according to the present invention.

FIG. 5 shows an example system 500 for milling the backside of a semiconductor device, using an alignment grid for navigation. Once the general location of an alignment point is known, apparatus 530 is aligned with the alignment point and is used to remove substrate until the alignment point is exposed. After an alignment point has been exposed, the location of selected regions within the substrate is referenced off of the exposed point. Alignment to such locations may be accomplished, for example, using CAD navigation locking software. Using the known location, apparatus 530 can be used to mill to the selected region.

The general location of the probe points may be discerned prior to milling, for instance, by using an alignment tool, such as a CAD navigation and alignment tool, manufactured by Knight, Inc. The alignment tool includes layout information for the semiconductor device. The layout information is used to align the milling apparatus with the designed location of an alignment point and to lock the alignment tool to one or more of the actual probe points, as is conventional. The location of the alignment points may also be discerned using other methods, such as global thinning of the backside of the semiconductor device, followed by the use of infrared microscopy or a laser scanning microscope.

The flip chip die 12 of FIG. 5 may, for example, include an alignment grid including alignment points extending into layers at different levels, providing markers at varying depths. In any of these example alignment point design scenarios, methods including those described herein may be used for milling the backside of a semiconductor device.

In yet another embodiment of the present invention, the alignment points extend beyond the circuitry into the bulk polysilicon layer as facilitated by the use of conventional isolation techniques, such as trench isolation. The use of alignment points that extend beyond the circuitry into the bulk polysilicon layer enables the detection of the alignment points by global milling of the semiconductor device without hitting any of the circuitry within the device. For example, the bulk polysilicon may be removed until the alignment points are revealed. Once the alignment points have been revealed, the milling is interrupted or stopped, depending on the application. The exposed alignment points provide an alignment grid for milling to selected regions within the substrate. A layout tool may then be locked to the alignment point for further navigation on the semiconductor device. Local milling may then be used to expose devices of interest.

Figure 6:
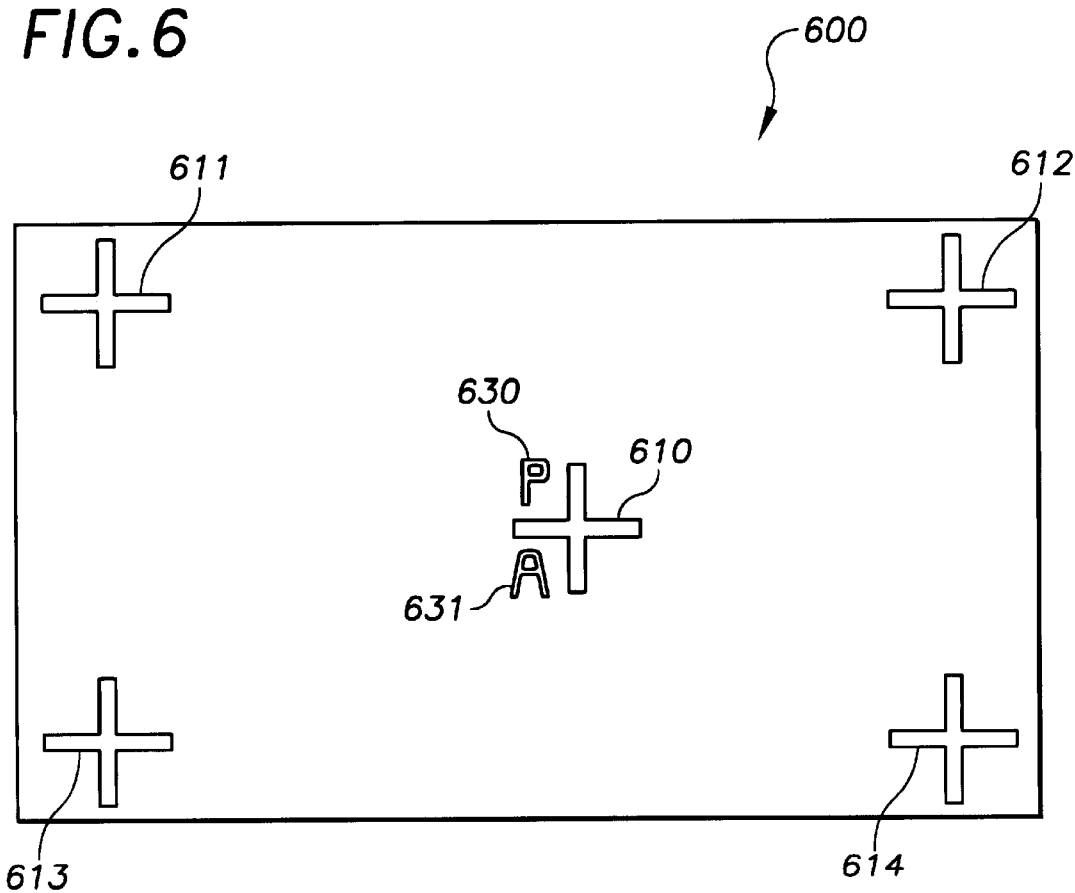
FIG. 6 shows an enlarged view of a marker in the substrate of a semiconductor device, according to yet another example embodiment of the present invention.

FIG. 6 shows a representation of markers formed within a portion of the substrate 600 of a semiconductor device, according to an example embodiment of the present invention that is consistent the above view of FIG. 4a. The markers may, for example, include a visually-detectable material, such as metal.

In one example embodiment, a marker comprising a recognizable pattern is formed within a semiconductor device at a known location. For instance, the recognizable pattern may be a cross, such as marker 610, or an alphanumeric character, such as marker 630. An alignment tool, such as is available from Knight, is used to initially locate the marker. When the marker is initially located, the substrate is milled to expose the marker. Once the marker is exposed, the alignment tool may use the marker to synchronize the actual location of the semiconductor device with the design layout contained in the memory of the alignment tool.

In addition, the marker may also be initially located by using a laser scanning device. After the marker is initially located, it may then be milled to, and the marker can be used to synchronize the alignment tool to perform further milling operations on the semiconductor device.

Additional markers may also be used to improve the synchronization accuracy of the alignment tool. For instance, marker 611 could be located first, using methods such as described herein. The substrate can then be milled to expose the marker, and the alignment tool can then be used to lock to the marker. Marker 612 can then be milled to, using the locked-on alignment tool to determine where to mill in order to reach marker 612. Once exposed, the alignment tool may also be locked on to marker 612. Markers 613, 614, and others may be subsequently milled to and locked on to in the same manner, improving the accuracy of the alignment.

According to another example embodiment of the present invention, the grid pattern is formed for both lateral-position and depth-position recognition using an approach that visually evolves to aid in position detection during a substrate-removal process. For example, both lateral-position and depth-position recognition can be realized using a peel-away pattern having a lateral two-dimension top-down appearance. As additional die material is removed, the part of pattern is also removed.

Figure 7C:
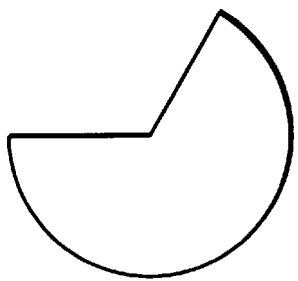
FIGS. 7a–7f show another example alignment grid from backside perspectives at various levels within the flip-chip die, also according to the present invention.
Figure 7B:
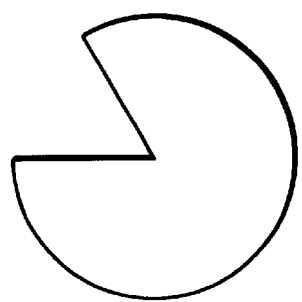
Figure 7A:
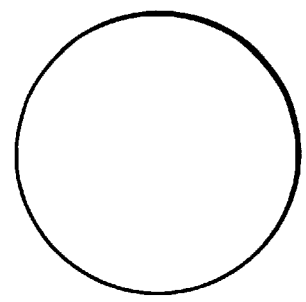
Figure 7F:
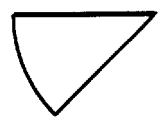
Figure 7E:
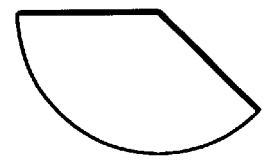
Figure 7D:
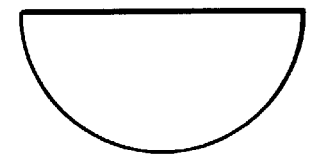

Using a multi-sectioned disc as an example, and referring to FIG. 7, at an early stage of the milling/pattern-recognition process, the top-down appearance provides a view of the disc with all sections intact, as shown in FIG. 7a. At a next stage of the milling/pattern-recognition process, the top-down appearance provides a view of the disc with only one section removed by the removal process, as shown in FIG. 7b. At subsequent stages of the milling/pattern-recognition process, progressive top-down appearances provide views of the disc with an increasing number of sections removed, as shown in FIGS. 7c–7f. The inverse approach, in which progressive top-down appearances provide views of the disc with an increasing number of sections being added as material is removed, is also useable, such as shown when viewing FIGS. 7a–7f in reverse-alphabetical order.

Another advantage of the use of markers is that they can be used as test sites. For instance, a marker, such as marker 610, may be used to mill in order to calculate the etch rate of the milling device. The location of marker 610 may be known by the design location, or may be further determined by methods described herein for locating markers within the device, including but not limited to the use of alignment tools, laser scanning devices, and infrared microscopy.

Accordingly, the present invention provides various embodiments for an alignment point structure and method for navigating and/or aligning as substrate from a die is being removed. It will be appreciated that these various embodiments are provided as example to describe various aspects of the present invention which is defined by the appended claims. Other implementations may also be used. For example, the alignment points described herein may, for example, be arranged to make up a portion of an alignment grid. A skilled artisan will recognize that the material types can vary and can be used to provide different feedback to the operator as different levels of the grid are reached during the material-removal process, and that different structural formations can be used. In this context and as just one of many example alternatives, the plugs can also be implemented using an unconnected architecture, and other shapes and layers can be added.

What is claimed is:

1. A method for manufacturing and analyzing the substrate of a semiconductor device to expose selected positions in the substrate, the method comprising:

forming a three-dimensional pattern in the semiconductor device over a circuit region, the three-dimensional pattern configured and arranged for post-manufacture analysis; and analyzing the circuit region by: removing substrate material from the semiconductor device from a side of the die opposite the circuit region until at least a part of the pattern is detected, and using the detected pattern to determine lateral and depth positions.

2. The method of claim 1, wherein semiconductor device includes a die having the pattern.

3. The method of claim 2, wherein the die is a flip-chip die.

4. The method of claim 2, wherein the flip-chip die includes a backside and opposite thereto a circuit side, wherein the circuit region is located along the circuit side.

5. The method of claim 4, wherein the pattern includes a metal line connected to ground at a first depth and a local interconnect at another depth.

6. The method of claim 4, wherein the pattern includes a metal line connected to ground at a first depth, at least one contact region at a second depth, and a local interconnect at a third depth.

7. The method of claim 6, wherein said at least one contact region interconnects the local interconnect and the metal line.

8. The method of claim 7, wherein the metal line is above the local interconnect as measured from the side of the device opposite the circuit region.

9. The method of claim 1, wherein the three-dimensional pattern is an alignment grid configured and arranged to provide location indicia to align a tool to the semiconductor device for use during the step of removing substrate material from the semiconductor device.

10. The method of claim 1, wherein the three-dimensional pattern comprises metal markers within the semiconductor device.

11. The method of claim 7, wherein the three-dimensional pattern comprises at least one alphanumeric symbol recognizable from the side of the device opposite the circuit region.

12. The method of claim 7, wherein the three-dimensional pattern comprises at least one alphanumeric symbol recognizable using a visual monitoring tool imaging the side of the device opposite the circuit region.

13. The method of claim 1, wherein the step of forming includes forming a cross recognizable using a visual monitoring tool imaging the side of the device opposite the circuit region.

14. The method of claim 1, wherein the step of forming includes forming a cross and letters recognizable using a visual monitoring tool imaging the side of the device opposite the circuit region.

15. The method according to claim 5, wherein the metal line is connected to the local interconnect via at least one conductive plug.

16. The method according to claim 15, wherein the conductive plug includes tungsten and the metal line includes aluminum.

17. The method according to claim 6, wherein changes in a current between the metal line and the contact region at the second depth versus a current between the metal line and the local interconnect at the third depth as the substrate material is removed from the semiconductor device indicates the depth position.

* * * * *